United States Patent [19]

Dammel et al.

[11] Patent Number: 5,234,791
[45] Date of Patent: Aug. 10, 1993

[54] RADIATION-CURABLE COMPOSITION AND RADIATION-SENSITIVE RECORDING MATERIAL PREPARED THEREFROM FOR USE WITH HIGH-ENERGY RADIATION

[75] Inventors: Ralph Dammel, Mainz-Bretzenheim; Karl-Friedrich Doessel, Wiesbaden; Juergen Lingnau, Mainz-Laubenheim; Juergen Theis, Frankfurt am Main, all of Fed. Rep. of Germany

[73] Assignee: Hoechst Aktiengesellschaft, Frankfurt am Main, Fed. Rep. of Germany

[21] Appl. No.: 369,677

[22] Filed: Jun. 21, 1989

[30] Foreign Application Priority Data

Jun. 25, 1988 [DE] Fed. Rep. of Germany ....... 3821584

[51] Int. Cl.$^5$ ............................................. G03L 1/492
[52] U.S. Cl. .................................... 430/270; 430/325; 522/68; 522/69
[58] Field of Search ............... 430/270, 325, 326; 522/68, 69

[56] References Cited

U.S. PATENT DOCUMENTS

| | | | |
|---|---|---|---|
| 3,692,560 | 9/1972 | Rosenkranz et al. | 117/93.31 |
| 4,189,323 | 2/1980 | Buhr | 430/281 |
| 4,193,799 | 3/1980 | Crivello | 430/319 |
| 4,247,611 | 1/1981 | Sander et al. | 430/286 |
| 4,289,845 | 9/1981 | Bowden et al. | 430/296 |
| 4,311,782 | 1/1982 | Buhr et al. | 430/270 |
| 4,398,001 | 8/1983 | Cheng et al. | 525/502 |
| 4,678,737 | 7/1987 | Schneller et al. | 420/270 |
| 4,816,375 | 3/1989 | Aoai | 430/270 |
| 4,840,867 | 6/1989 | Elaesser et al. | 430/270 |
| 4,845,011 | 7/1989 | Wilczak et al. | 430/272 |
| 4,946,759 | 8/1990 | Doessel et al. | 430/270 |

FOREIGN PATENT DOCUMENTS

| | | |
|---|---|---|
| 565734 | 12/1987 | Australia . |
| 0164248 | 12/1985 | European Pat. Off. . |
| 0232972 | 8/1987 | European Pat. Off. . |
| 3821585 | 3/1989 | Fed. Rep. of Germany . |

OTHER PUBLICATIONS

T. Yamoaka et al., "Crosslinking of Polymers with Irradiating Rh, $L_a$ X Ray-Effect of Active Groups and a Heavy Atom on Crosslinking", Phot. Sci. Eng. 23, pp. 196–202 (1979).

Vollenbroek et al., "A Study of Catalytically Transformed Negative X-Ray Resists. Based on Aqueous Base Developable Resin, an Acid Generator and a Crosslinker" Microelectronic Engineering 6 pp. 467–471 (1987).

James Crivello, "Possibilities for Photoimaging Using Onium Salts", Polym. Eng. Sci. 23, pp. 953–956 (1983).

M. J. Bowden et al., "A Sensitive Novolac-Based Positive Electron Resist", J. Electrochem. Soc.: Solid-State Science & Technology, 128, p. 1304, (1981).

Gary Taylor, "The Role of Inorganic Materials in Dry-Processed Resist Technology", Solid State Technology, 124 pp. 145–155 (1984).

Ershov et al., Studies in Organic Chemistry: Acid-Base Equilibrium of Quinonediazides, Elsevier Scientific Publishing Company, 1981, pp. 59–77.

Primary Examiner—Jack P. Brammer
Attorney, Agent, or Firm—Foley & Lardner

[57] ABSTRACT

A radiation-curable composition which comprises a compound that forms an acid under the action of high-energy radiation and an acid-hardening substance, wherein the compound forming an acid contains aromatically linked chlorine or bromine and has a $pK_a$ value below 12. The composition and the recording material prepared therefrom display increased sensitivity, improved resolution and a high etch resistance after development.

26 Claims, No Drawings

RADIATION-CURABLE COMPOSITION AND RADIATION-SENSITIVE RECORDING MATERIAL PREPARED THEREFROM FOR USE WITH HIGH-ENERGY RADIATION

BACKGROUND OF THE INVENTION

The invention relates to a negative-acting, radiation-curable composition comprising a compound that forms an acid under the action of high-energy radiation and an acid-hardening compound.

In conventional UV-lithography, the limit of resolution is predetermined by the wavelength of the radiation employed. Increasing miniaturization of dimensions in the fabrication of chips therefore requires new lithographic techniques in the submicron range, electron beams or X-rays being used in the process because of their extremely short wavelengths. It has been found that resist materials which are suitable for use as electron-beam resists can also be employed as X-ray resists, and vice versa.

Resist materials customarily used for this application comprise acrylates and methacrylates [G. M. Taylor, "Solid State Technology", 124 (1984)]. In these materials, sensitivity and pattern resolution have, in most cases, proved to be incongruous properties. In order to obtain relatively high sensitivities, halogens are usually incorporated in the resist. In the case of positive-acting resists, fluorine and chlorine are generally employed, whereas negative-acting resists preferably contain bromine and iodine, apart from chlorine [T. Yamaoka et al., Phot. Sci. Eng. 23, 196 (1979)].

Negative-acting, i.e., radiation-curable resists generally show a higher sensitivity than positive-acting resists. However, as explained above, they cannot have a high resolution in the submicron range at the same time. Positive-acting resists based on methacrylate, on the other hand, yield a high resolution but, with the exception of the resists based on polymethacrylonitrile, they do not withstand the plasma-etching processes used for the patterning of semiconductors. The methacrylate resists, for their part, have an insufficient sensitivity.

Polyalkenesulfones, in particular polybutene-1-sulfone, are the polymers with the highest sensitivity to electron beams and X-rays so far known. It is, however, a disadvantage of compounds of this category that they have a reduced resistance to plasma etching processes; they can thus be used for the production of masks, but they are unsuitable for use in the fabrication of semiconductors with the aid of masks made of this material. It has therefore been suggested to combine polyalkenesulfones with novolac resins that are plasma-etch resistant, as is generally known [M. J. Bowden et al., J. Electrochem. Soc., 128, 1304 (1981); U.S. Pat. No. 4,289,845]. Unfortunately, however, the two polymers showed a severe incompatibility, which impaired resolution; and when it was attempted to improve compatibility by admixing further components, a loss of sensitivity had to be accepted (U.S. Pat. No. 4,398,001).

To maintain high sensitivities within the context of improved general characteristics, in particular, improved plasma-etch resistance, photocatalytically acting resists were developed. Examples of positive-acting systems of this type are described, inter alia, in DE-A-27 18 254, 29 28 636 and 38 21 585.

Corresponding negative-acting systems comprise, for example, resists which, upon irradiation, are crosslinked in a dimerizing reaction, such as polymeric cinnamic acid derivatives and polyacrylates. Resists of this type are relatively insensitive. When the principle of photocatalysis is utilized in negative-acting systems, a difference is made between resists that can be photopolymerized by free radicals and resists which, due to photoinduced reactions, are crosslinked cationically, by addition, substitution or condensation. The first-mentioned resists exhibit considerable drawbacks in the imaging quality. Their applicability to uses in the submicrometer range is therefore limited.

The application of acid-hardening resins in photoresist formulations has been known for a long time. As described, for example, in U.S. Pat. No. 3,692,560 halogen-containing benzophenones in combination with melamine resins or urea-formaldehyde resins can be used as UV resists. DE-A-27 18 259 (=U.S. Pat. No. 4,189,323) describes the use of halogenated derivatives of s-triazine as photolytically activatable acid donors for positive and negative-acting systems, for example, for acid-hardening urea-formaldehyde, melamine-formaldehyde and phenol-formaldehyde resins (column 5). Examples of formulations of this kind are also specified by Vollenbroek et al., Microelectronic Engineering 6, 467, (1987).

It is also possible to use onium salts, such as diphenyl iodonium salts of non-nucleophilic acids, e.g., of $HSbF_6$, $HAsF_6$ or $HPF_6$, as photolytically activatable acid formers. DE-A-27 30 725 describes the use of starters of this kind in resist formulations containing epoxides as acid-hardening materials. A general account of the use of onium salts in acid-hardening systems is given by J. V. Crivello, Polym. Eng. Sci. 23, 953 (1983).

EP-A-0 164 248 discloses photo-curable compositions on a basis of acid-hardening resins and naphthoquinone diazides or o-nitrobenzoic acid derivatives.

In EP-A-0 232 972 halogenated compounds, such as DDT or γ-hexachlorocyclohexane, are described, which show virtually no absorption above 299 nm and are used as photoinitiators in acid-hardening negative photoresists.

In all systems described above the initiator compounds do not participate in the actual crosslinking process and are themselves insoluble in aqueous-alkaline developers, with the exception of the onium salts. This leads to drastically reduced development rates in those areas, where the non-exposed resist layer is to be removed by the developer. The amount of starter compound which can be added, and consequently also the sensitivity of the resist prepared, are thus clearly limited. The use of onium salts and also the use of the initiators described in EP-A-0 232 972, which are also known as plant protection agents, are moreover critical from a physiological standpoint.

SUMMARY OF THE INVENTION

Accordingly, it is an object of the present invention to provide a negative-acting resist system for the recording of high-energy radiation which is highly sensitive to high-energy radiation, in particular X-rays and electron emission.

Another object of the present invention is to provide a high-energy radiation-curable resist system which can be processed in daylight or artificial light substantially without any particular precautionary measures.

A further object of the present invention is to provide a high-energy radiation-curable resist system which yields resist patterns of high resolution after development with aqueous-alkaline developers and has a good resistance to liquid and plasma etching media.

Yet another object of the present invention is to provide a high-energy radiation-curable resist system which is physiologically safe.

In accomplishing the foregoing objectives, there has been provided, in accordance with one aspect of the present invention, a composition which is curable by high-energy radiation, comprising a compound that forms an acid under the action of high-energy radiation and an acid-hardening substance, wherein the compound that forms an acid comprises at least one chlorine or bromine atom linked to an aromatic carbon atom and has a $pK_a$ value below 12.

Of the acid-forming compounds containing chlorine or bromine linked to aromatic carbon atoms those are preferred which have a $pK_a$ value of 6 to 10.

In a preferred embodiment, the acid-forming compound is of the general formula

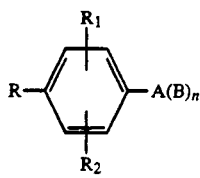

in which
R is OH or COOH,
$R_1$ and $R_2$ are identical or different and denote hydrogen, chlorine, bromine, alkyl, alkyl substituted by aryl, alkoxy, aryloxy or hydroxyl groups or by fluorine atoms, aryl, or aryl substituted by alkoxy, aryloxy or hydroxyl groups or by halogen atoms, and
$n=0$ to 3, wherein
A denotes hydrogen, chlorine, bromine, alkyl, optionally substituted by alkoxy, aryloxy, hydroxyl or aryl groups or by fluorine atoms; aryl, optionally substituted by alkoxy, aryloxy, hydroxyl or carboxyl groups or by halogen atoms if $n=0$; denotes a single bond, —O—, —S—, —SO$_2$—, —NH—, —NR$_3$—, alkylene or perfluoroalkylene if $n=1$;
denotes

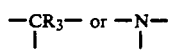

if $n=2$; and denotes

if $n=3$;
denotes

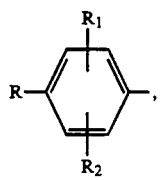

carboxyl, substituted carbonyl, in particular alkylcarbonyl or arylcarbonyl, carboxyalkyl or substituted sulfonylimidocarbonyl, and
$R_3$ denotes alkyl, in particular ($C_1$-$C_3$)alkyl, or aryl, in particular phenyl.

In accordance with another aspect of the present invention there is provided a radiation-curable recording material comprising a support and a radiation-curable composition as described above.

In accordance with a further aspect of the present invention, there is provided a process for recording high-energy radiation which comprises the steps of providing a radiation-curable recording material formed by applying to a support a radiation-curable layer which comprises the above-described radiation-curable composition, drying the recording material, irradiating the recording material imagewise with high-energy radiation, and developing the image so formed by removing the non-irradiated portions of the radiation-curable layer with an aqueous-alkaline developer.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

It was unexpected to find that, using starters of this kind, acid-hardening compositions even of particularly high sensitivity are obtained and that the high starter concentrations required do not have an adverse influence on the development characteristics or the thermal stability of the resist patterns obtained, as is the case, for example, when the starters described in EP-A-0 232 972 are employed. This is ascribed to the fact that the alkali-solubility of the non-exposed resist areas is considerably increased, due to the structure of the starter. In the exposed areas of the resist, on the other hand, the starter, depending on its structure, participates in the crosslinking reaction.

The $pK_a$ value of chemical compounds can be determined according to conventional methods. It is, however, also possible to make a theoretical calculation, e.g., using the "CAMEO" program.

Preference is, in particular, given to compounds, in which
$R_1$ and $R_2$ are identical and denote, in particular, chlorine or bromine and are, in each case, in the o-position relative to R, and
R denotes a hydroxyl group.

Also preferred are those compounds,
in which
A (if $n=1$ and B=

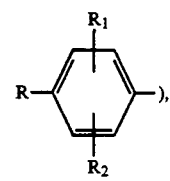

denotes $-SO_2-$, propylene or perfluoropropylene, in the two last-mentioned instances, preferably propylidene or perfluoropropylidene, or A (if n=1 and B=alkylcarbonyl, in particular, methylcarbonyl, carboxyalkyl, in particular, carboxymethyl or substituted sulfonylimidocarbonyl, in particular, p-toluenesulfonylimidocarbonyl) denotes $-O-$, $-NH-$ or $-NR_3-$, or A (if n=0) denotes hydroxyl, carboxyl or alkyl which is substituted, on every other carbon atom, by phenyl or chlorinated or brominated phenyl.

Particular preference is also given to phenolic resins, in which the unsubstituted o- and/or p-positions relative to the hydroxyl function are partially or completely chlorinated or brominated.

Novolac types obtained by condensing p-chloro- or p-bromo-o,o'-bis-methylol-phenol and m-cresol which may be substituted by chlorine or bromine are particularly preferred.

Particularly preferred are compounds in which, if n=0 and A=substituted carbonyl,
R denotes hydroxyl, and
$R_1$ and $R_2$ each being in the o-position relative to R, denote chlorine or bromine, or in which,
if n=0 and A=alkyl (which may be substituted),
R denotes hydroxyl, and
$R_1$ l and R2, each being in the o-position relative to R, denote hydrogen, chlorine or bromine.

The amount of acid-forming starters contained in the radiation-sensitive composition of the present invention is, in general, about 2 to 50% by weight, preferably about 4 to 25% by weight, in each case relative to the total weight of the radiation-sensitive layer.

If the starter is in a polymeric form and is, in particular, part of the binder, the constituent amounts specified for the corresponding polymeric binders are regarded as an upper limit. The respective content of the starter or of the molecular groups in the polymer, which cause the starting process, can be calculated from the mixing ratios of the monomeric initial ingredients.

Suitable systems which can be catalytically hardened by acid comprise crosslinkable systems, in which the crosslinking component and the functional group which is capable of crosslinking and reacts with the crosslinking component, are contained in one and the same molecule, preferably in an oligomeric or polymeric molecule. Examples are copolymers of N-alkoxymethylmethacrylamide, for example, with acrylic acid or pyrocatechol monomethacrylate, if appropriate, in the presence of further comonomers, as described, for example, in EP-A-0 184 044.

Acid-hardening components which can be used further comprise compounds containing cationically polymerizable groupings. Mention is made of vinyl ethers, epoxides, and the like. A general review is given in "Makromol. Chemie, Macromolecular Symposia", Vol. 13/14, Munich 1988. The preferably used compounds contain a plurality of the groupings indicated above.

Further suitable acid-hardening components include compounds which, when catalyzed by acid, enter into condensation reactions with themselves or with the binder. Melamine-formaldehyde resins, benzoguanamine-formaldehyde resins, glycoluril-formaldehyde resins, urea-formaldehyde resins and also hydroxymethylated phenols and cresols, as described, for example, in EP-A-0 212 482, are mentioned in this connection.

Preference is given to compositions in which the reactive groups are present in different molecules. In that case, the binder contains a crosslinkable functional group. Examples are $-SH$, $-OH$, $-CONH_2$ and $-COOH$ groups. Moreover, compositions which can be hardened by condensation with formaldehyde in the presence of acid are suitable. These include, in particular, appropriately substituted phenolic resins. Instead of formaldehyde, compounds which release formaldehyde, for example, trioxane, can also be employed. The latter are preferably used in combination with phenolic resins.

The binders used in the composition according to the present invention are insoluble in water and soluble in aqueous-alkaline media and in organic solvents. To achieve this, the binders contain functional groups having a $pK_a$ below 12, preferably between 6 and 10. Typical are phenols, carboxylic acids, but also sulfonamides and imides.

Phenolic resins of the novolac type, for example, phenol-formaldehyde resins, cresol-formaldehyde resins, co-condensates and mixtures thereof, and phenol and cresol condensates with other aldehydes are preferably used.

In addition, the following polymers can be used: Polymers of styrene containing units of alkenylsulfonylaminocarbonyloxy- or cycloalkenylsulfonylaminocarbonyloxy- (EP-A-0 184 804), polymers of acrylic, methacrylic, maleic and itaconic acids, etc., which may have lateral, crosslinking $-CH_2OR$ groups (EP-A-0 184 044), polymers of vinyl monomers with alkenylphenol units (EP-A-0 153 682), polyvinylphenols (DE-C-23 22 230), polymeric binders with lateral, phenolic hydroxyl groups (EP-A-0 212 439 and 0 212 440), copolymers of styrene and maleic anhydride (DE-A-31 30 987), polymers of unsaturated (thio)phosphinic acid iso(thio)cyanates with a polymer containing active hydrogen (DE-A-36 15 612 and 36 15 613), polymers containing Vinyl acetate units, vinyl alcohol units and vinyl acetal units (EP-A-0 216 083) and also polyvinyl acetals containing units of hydroxyaldehydes (DE-A-36 44 162).

To improve the general characteristics it is also possible to use mixtures comprising a plurality of the binders mentioned.

The amount of binder generally ranges from about 1 to 90% by weight, in particular, from 5 to 90% by weight and preferably from 50 to 90% by weight, relative to the total weight of the radiation-sensitive composition.

If polymeric starters are used, the above-indicated binders which are insoluble in water and soluble in aqueous alkali may, if appropriate, also be dispensed with. For this purpose, chlorinated or brominated polystyrenes or polyvinyl phenols are used, in particular. As a consequence, the content of polymeric starter can even exceed the quantitative range specified for the starter content. It is, in particular, possible to employ amounts of over 50% by weight and up to 100% by weight, minus the content of the acid-cleavable compound.

Aside from this, the binder can also be prepared by condensing a chlorine or bromine-containing aromatic starter with an initial monomer which can be used for the preparation of conventional binders. It is then a prerequisite that the acid-forming chlorine or bromine-containing compound contains groups which are capable of condensation or polymerization.

Of the monomeric constituents of conventional binders, phenols and cresols, specifically m-cresol, are particularly preferred for this condensation. Condensation is advantageously carried out using approximately equimolar quantities.

In addition to this incorporation of the halogen-containing starter into known binders, to form a polymeric starter which simultaneously acts as a binder, simple mixing of polymeric starters with customary binders is also possible. In particular, chlorine or bromine-containing styrene derivatives are mixed with novolac resins, preferably in approximately equimolar quantities.

It is possible to add to the radiation-sensitive compositions according to the invention, if desired, dyes, pigments, plasticizers, wetting agents and levelling agents and also polyglycols and cellulose ethers, for example ethylcellulose, for improving special properties such as flexibility, adhesion and gloss.

Preferably, the radiation-sensitive composition according to the invention is dissolved in solvents such as ethylene glycol; glycol ethers such as glycol momomethyl ether, glycol dimethyl ether, glycol monoethyl ether or propylene glycol monoalkyl ethers, in particular propylene glycol methyl ether; aliphatic esters such as ethyl acetate, hydroxyethyl acetate, alkoxy-ethyl acetate, n-butyl acetate, propylene glycol monoalkyl ether acetate, in particular propylene glycol methyl ether acetate or amyl acetate; ethers such as dioxane; ketones such as methyl ethyl ketone, methyl isobutyl ketone, cyclopentanone and cyclohexanone; dimethylformamide, dimethylacetamide, hexamethylphosphoric amide, N-methyl-pyrrolidone, butyrolactone, tetrahydrofuran and in mixtures thereof. Particular preference is given to glycol ethers, aliphatic esters and ketones.

The solutions that are formed with the components of the radiation-sensitive composition usually have a solids content of about 5 to 60% by weight, preferably up to 50% by weight.

Suitable supports for the radiation-sensitive recording material include all materials of which capacitors, semiconductors, multi-layer printed circuits and integrated circuits are made. Surfaces made of pure silicon and thermally-oxidized and/or aluminum-coated silicon material, that, if desired, can also be doped, including all other supports or substrates customary in semiconductor technology, such as, for example, silicon nitride, gallium arsenide and indium phosphide, are particularly mentioned. Further suitable are those substrates known from the production of liquid crystal displays, such as glass and indium/tin oxide; and also metal sheets and foils, for example made of aluminum, copper, zinc; bimetallic and trimetallic foils; electrically non-conducting films which are vacuum-metallized; and, if desired, SiO$_2$ materials coated with aluminum and paper. These substrates can be subjected to a prior heat treatment, roughened on the surface, etched or treated with chemicals to improve desirable properties, for example, to increase hydrophilicity.

In a particular embodiment, the radiation-sensitive recording material can contain an adhesion promoter for better adhesion, in the resist or between the resist and the support or substrate. In the case of silicon or silicon dioxide substrates, suitable adhesion promoters are of the aminosilane type, such as, for example, 3-aminopropyltriethoxysilane or hexamethyldisilazane.

Examples of supports which can be used for the preparation of printing plates for letter press printing, planographic printing, screen printing, gravure printing and also for relief copies are aluminum plates, that may be anodically oxidized, grained and/or silicated, zinc plates, steel plates, which may have been treated with chromium, and also plastic sheets or paper.

The recording material according to the invention is subjected to imagewise irradiation using sources of high-energy radiation; electron emission or X-rays are preferred. In the event of using sufficiently transparent binders, imagewise irradiation by means of deep UV is also feasible.

The layer thickness varies depending on its field of application. It is between about 0.1 and 1000 μm, in particular between about 1 to 10 μm.

The radiation-sensitive composition can be applied to the support by spray-coating, flow-coating, roller-coating, spin-coating and dip-coating. The solvent is then removed by evaporation, leaving the radiation-sensitive layer on the surface of the support. The removal of the solvent can, if necessary, be promoted by heating the layer to temperatures of up to 150° C. However, it is also possible initially to apply the composition in the above-mentioned manner to a temporary support, from which it is transferred to the final support material under pressure and elevated temperature. Any materials which have been mentioned for use as support materials can basically also be employed as temporary supports, provided they are flexible. The layer is then subjected to imagewise irradiation. Preference is given to high-energy radiation, such as X-rays or electron beams. Particularly preferred is high-energy synchrotron radiation at dosage values from 20 to 200 mJ/cm$^2$ or the radiation of an electron beam recorder. In particular cases, the actual differentiating reaction (crosslinking) can take place at room temperature. As a rule, however, it is advantageous to carry out a post exposure bake for about 1 to 30 minutes, preferably at temperatures from about 90° to 150° C. An image pattern is then developed in the radiation-sensitive layer, by treating the layer with a developer solution which dissolves or removes the non-irradiated portions of the material.

The developers used are solutions of alkaline reagents, such as, for example, silicates, metasilicates, hydroxides, hydrogen phosphates and dihydrogen phosphates, carbonates and bicarbonates, in particular of alkali metal or ammonium ions, but also of ammonia or organic ammonium bases and the like. The content of these substances in the developer solution is in general about 0.1 to 15% by weight, preferably about 0.5 to 5% by weight, relative to the weight of the developer solution.

The following examples are intended to illustrate the preparation of the compounds containing aromatic chlorine or bromine, which are contained in the radiation-sensitive composition according to the present invention and some of which are new. Quantities are usually specified in parts by weight (pbw), quantitative ratios and percentages are by weight, unless stated otherwise.

EXAMPLE 1

A coating solution was prepared, containing
17 pbw of a cresol-formaldehyde novolac having a softening range from 105° to 120° C.;
4 pbw of tetrabromo-bisphenol A,
5 pbw of poly(alkoxymethyl)melamine; mixture of methoxy and higher alkoxy compounds (Cymel 1116; Cyanamide Corporation), and
74 pbw of propylene glycol methyl ether acetate (PGMEA).

A silicon wafer which had been treated with an adhesion promoter (hexamethyl disilazane) was spin-coated with the solution, at 5,000 rpm. After drying for 3 minutes in a circulating air oven at 95° C., a 1.0 μm thick layer was obtained. Imagewise exposure was effected by means of synchrotron radiation (BESSY, Berlin, 2 mm air gap) at a dosage of 200 mJ cm2, through a gold-on-silicon mask. The experimental set-up is described in A. Heuberger, "X-Ray Lithography", Microelectronic Engineering 3, 535-1985). After exposure, the wafer was heated for 10 minutes in a circulating air oven at 100° C. and then developed for 60 seconds in a solution of 1% of NaOH,
0.4% of alkylaryl disulfonic acid (sodium salt), and
0.1% of a cation-active wetting agent (heterocyclic quaternary ammonium base) in
98.5% of fully demineralized water.

A faultless image was obtained showing all details of the mask and perfectly rendering even lines and spaces of 0.3 μm. There was no undercutting of the resist walls, which showed angles of nearly 90° in a micrograph taken under a scanning electron microscope.

EXAMPLE 2

A coating solution was prepared, containing
15 pbw of the novolac specified in Example 1,
8.5 pbw of 1,1,1-tris-(3,5-dibromo-4-hydroxyphenyl)ethane,
5 pbw of Cymel 1116,
71.5 pbw of PGMEA.

The solution was applied by spin-coating as in Example 1. After drying on a hot plate (110° C., 1 minute), irradiation was carried out as in Example 1, at 90 mJ/cm2. Following a post exposure bake for 2 minutes at 110° C. the layer was developed for 150 seconds with a solution of:

2.65% of sodium metasilicate×9H2O,
1.7% of trisodium phosphate×12H2O, and
0.15% of sodium dihydrogen phosphate in 95.5% of fully demineralized water.

The patterns obtained corresponded to those of Example 1.

Preparation of
1,1,1-tris-(3,5-dibromo-4-hydroxyphenyl)ethane 102 g of tris-(4-hydroxyphenyl)ethane were suspended in a mixture of 500 ml of glacial acetic acid and 250 ml of water. 334 g of bromine were then added dropwise to the agitated suspension at 10° C. After the reaction of bromine had gone to completion, 750 ml of water were added and the crystals which precipitated were filtered off by suction. The crystals were washed with water, recrystallized from toluene and then dried. The product obtained had a melting point of 276°-278 C. The NMR spectrum (CDCl3) showed the following signals: CH3: δ=2.05 (3H)s; OH: δ=5.89 (3H)s; phenyl: δ=7.1 (6H)s.

EXAMPLE 3

The procedure of Example 2 was repeated, except for the fact that Cymel 1116 was replaced by the melamine resin Maprenal 900 (Cassella AG), which is a corresponding polyalkoxymethylmelamine containing C1 and n-C4-alkoxy groups. The developing time was 20 seconds in the same developer as used in Example 2.

EXAMPLE 4

A coating solution was prepared, containing
20 pbw of the novolac of Example 1,
3.4 pbw of tetrachloro-bisphenol A,
5.1 pbw of Cymel 1116,
71.5 pbw of cyclohexanone.

After spin-coating upon a silicon wafer at 5000 rpm, the layer was dried for 1 minute at 110° C., then irradiated imagewise at 30 mJ/cm2, thereafter baked for 30 minutes at 105° C. and finally developed during 165 seconds in a solution of 5.3% of sodium metasilicate×9H2O,
3.4% of trisodium phosphate×12H2O, and
0.3% of sodium dihydrogen phosphate in
91% of fully demineralized water.

EXAMPLE 5

When the amount of tetrachloro-bisphenol A used in Example 4 was reduced to 0.6 pbw a developing time of 420 seconds was required, at an otherwise identical procedure.

EXAMPLE 6

A coating solution was prepared, containing
20 pbw of novolac according to Example 1,
5.1 pbw of neopentyl-diglycidyl ether, and
8.5 pbw of tetrabromo-bisphenol A in
71.4 pbw of PGMEA.

The layer obtained was dried for 1 minute at 110° C. After irradiation at 200 mJ/cm2, a post exposure bake was carried out for 3 minutes at 120° C. The developing time was 60 seconds in the developer specified in Example 4.

EXAMPLE 7

A coating solution was prepared, containing
22.7 pbw of a copolymer comprising 84% by weight of pyrocatechol monomethacrylate and 16% by weight of N-methoxymethyl methacrylamide, and
5.7 pbw of tetrabromo-bisphenol A in
71.6 pbw of PGMEA.

The layer obtained was dried for 1 minute at 110° C. After irradiation at 200 mJ/cm2 and a post exposure bake for 3 minutes at 130° C., development was effected within 30 seconds in the developer specified in Example 4.

EXAMPLE 8 (COMPARATIVE EXAMPLE)

A coating solution was prepared, containing
20 pbw of the novolac of Example 1,
3.4 pbw of DDT, and
5.1 pbw of Cymel 1116 in
71.5 pbw of PGMEA.

This formulation corresponds to that of Example 4, however, using the known starter DDT which is not alkali-soluble. The layer obtained was dried for 1 minute at 110° C. Irradiation at 30 mJ/cm2 followed by a post exposure bake for 3 minutes at 105° C. produced a resist film that could not be developed in the non-exposed areas, even after treating it for 30 minutes with the developer specified in Example 4.

EXAMPLE 9 (COMPARATIVE EXAMPLE)

When the amount of DDT was reduced to 0.6 pbw, analogously to Example 5, the layer could be developed using the developer of Example 4, but development took a considerably longer time (18 minutes), as compared with Example 5.

What is claimed is:

1. A negative-working radiation-sensitive composition which is curable by high-energy radiation, comprising in admixture
   (a) a compound that forms an acid under the action of high-energy radiation which is present in an amount sufficient to effect hardening of the compound or combination of compounds (b), and
   (b) a compound or combination of compounds capable of being hardened under the action of said acid (a), which is present in an amount sufficient to effect hardening of the negative-working composition, wherein compound (a) forms an acid in response to high energy radiation, which acid acts on compound (b) to harden the composition, and wherein the compound that forms an acid has a $pK_a$ value below 12 and is represented by the general formula

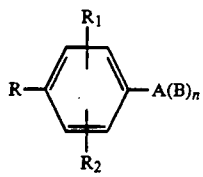

comprising at least one chlorine or bromine atom linked to an aromatic carbon atom, in which R is OH or COOH, $R_1$ and $R_2$ are identical or different and denote hydrogen, chlorine, bromine, alkyl, alkyl substituted by aryl, alkoxy, aryloxy or hydroxyl groups or by fluorine atoms, aryl, or aryl substituted by alkoxy, aryloxy or hydroxyl groups or by halogen atoms, and n is 0 to 3, wherein A is hydrogen, chlorine, bromine, alkyl, optionally substituted by alkoxy, aryloxy, hydroxyl or aryl groups or by fluorine atoms; aryl, if appropriate substituted by alkoxy, aryloxy, hydroxyl or carboxyl groups or by halogen atoms if n=0; is a single bond, —O—, —S—, —SO$_2$—, —NH—, —NR$_3$—, alkylene or perfluoroalkylene if n is 1; is

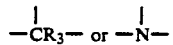

if n=2; and is

if n=3,
B denotes

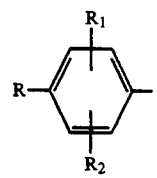

carboxyl, substituted carbonyl, carboxylakyl or substituted sulfonylimidocarbonyl, and $R_3$ is alkyl or aryl.

2. A radiation-curable composition as claimed in claim 1, wherein the acid-forming compound has a $pK_a$ value of 6 to 10.

3. A radiation-curable composition as claimed in claim 1, wherein the acid-forming compound comprises a compound of the general formula

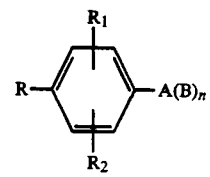

comprising at least one chlorine or bromine atom linked to an aromatic carbon atom, in which R is OH or COOH, $R_1$ and $R_2$ are identical or different and denote hydrogen, chlorine, bromine, alkyl, alkyl substituted by aryl, alkoxy, aryloxy or hydroxyl groups or by fluorine atoms, aryl, or aryl substituted by alkoxy, aryloxy or hydroxyl groups or by halogen atoms, and n=0 to 3, wherein A denotes hydrogen, chlorine, bromine, alkyl, optionally substituted by alkoxy, aryloxy, hydroxyl or aryl groups or by fluorine atoms; aryl, optionally substituted by alkoxy, aryloxy, hydroxyl or carboxyl groups or by halogen atoms if n=0; denotes a single bond, —O—, —S—, —SO$_2$—, —NH—, —NR$_3$—, alkylene or perfluoroalkylene if n=1; denotes

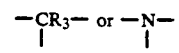

if n=2; and denotes

if n=3, denotes

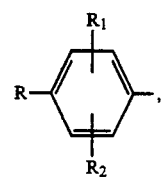

carboxyl, substituted carbonyl, carboxyalkyl or substituted sulfonylimidocarbonyl, and R₃ denotes alkyl or aryl.

4. A radiation-curable composition as claimed in claim 1, consisting essentially of the compound that forms an acid and the compound or combination of compounds that is capable of being hardened under the action of said acid.

5. A on-curable composition as claimed in claim 4, wherein B denotes alkylcarbonyl or arylcarbonyl.

6. A radiation-curable composition as claimed in w R₃ denotes C₁-C₃ alkyl or phenyl.

7. A radiation-curable composition as claimed in wherein R₁ and R₂ are identical and denote chlorine or bromine, and are in each case in the o-position relative to R, and R denotes a hydroxyl group.

8. A radiation-curable composition as claimed in claim 4, wherein n=1, B=

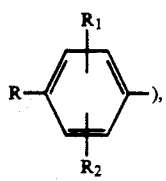

and A denotes —SO₂—, propylene or perfluoropropylene.

9. A radiation-curable composition as claimed in clam 4, wherein n=1, B denotes alkylcarbonyl, carboxyalkyl, or sulfonylimidocarbonyl, and A denotes —O—, —NH—, or —NR₃—.

10. A radiation-curable composition as claimed in claim 9, wherein B denotes methylcarbonyl, carboxymethyl or p-toluenesulfonylimidocarbonyl.

11. A radiation-curable composition as claimed in claim 4, wherein n=0 and A denotes hydroxyl, carboxyl, or alkyl which is substituted, on every other carbon atom, by phenyl, chlorinated phenyl or brominated phenyl.

12. A radiation-curable composition as claimed in claim 4, wherein n=0, A denotes substituted carbonyl, R denotes hydroxyl and R₁ and R₂ denote chlorine or bromine, with each being in the o-position relative to R.

13. A radiation-curable composition as claimed in claim 4 wherein n=0, A denotes substituted or unsubstituted alkyl, R denotes hydroxyl and R₁ and R₂ denote hydrogen, chlorine or bromine, with each being in the o-position relative to R.

14. A radiation-curable composition as claimed in claim 4, wherein the acid-forming compound comprises a monomer and the composition comprises a binder that is insoluble in water and soluble in aqueous-alkaline solution.

15. A radiation-curable composition as claimed in claim 15 wherein the acid-forming compound comprises a polymer.

16. A radiation-curable composition as claimed in claim 15, wherein the acid-forming compound comprises a hydroxystyrene polymer or copolymer or a phenolic resin.

17. A radiation-curable composition as claimed in claim 15, wherein the composition additionally contains a polymeric binder that is insoluble in water and soluble in aqueous-alkaline solution.

18. A radiation-curable composition as claimed in claim 4, wherein the polymeric binder comprises functional groups having a pK$_a$ below 12.

19. A radiation-curable composition as claimed in claim 1, comprising about 2 to 50% by weight of the acid-forming compound and about 1 to 90% by weight of the binder.

20. A radiation-curable recording material for use with high-energy radiation, comprising a support and a radiation-curable layer which comprises a radiation-curable composition as claimed in claim 1.

21. A radiation-curable recording material as claimed in claim 20, further comprising an adhesion promoter.

22. A radiation-curable recording material as claimed in claim 20, wherein the radiation-curable composition further comprises an adhesion promoter.

23. A radiation-curable composition as claimed in claim 4, wherein the compound that forms an acid is tetrabromo-bisphenol A.

24. A radiation-curable composition as claimed in claim 4, wherein the compound that is capable of being hardened under the action of said acid is poly(alkoxymethyl)-methane.

25. A radiation-curable composition as claimed in claim 23, wherein the compound that is capable of being hardened under the action of said acid is poly(alkoxymethyl)-melamine.

26. A radiation-curable composition as claimed in claim 4, wherein the composition is curable by X-ray radiation or electron emission.

* * * * *

UNITED STATES PATENT AND TRADEMARK OFFICE
CERTIFICATE OF CORRECTION

PATENT NO. : 5,234,791
DATED : August 10, 1993
INVENTOR(S) : DAMMEL et al.

It is certified that error appears in the above-indentified patent and that said Letters Patent is hereby corrected as shown below:

Column 12, claim 3, line 59, please insert --B-- before "denotes".

Column 13, claim 5, line 9, delete "on-curable" and insert --radiation-curable--;
        claim 6, line 12, delete "w" and insert --4--;
        claim 7, line 14, after "in" insert --claim 4,--;

Signed and Sealed this

Seventh Day of June, 1994

BRUCE LEHMAN

*Attest:*

*Attesting Officer*    *Commissioner of Patents and Trademarks*

UNITED STATES PATENT AND TRADEMARK OFFICE
CERTIFICATE OF CORRECTION

PATENT NO. : 5,234,791
DATED : August 10, 1993
INVENTOR(S) : DAMMEL et al.

It is certified that error appears in the above-indentified patent and that said Letters Patent is hereby corrected as shown below:

Column 14, claim 15, line 9, please delete "15" and insert --1--.

Signed and Sealed this

Sixteenth Day of August, 1994

Attest:

BRUCE LEHMAN

Attesting Officer     Commissioner of Patents and Trademarks